(12) United States Patent
Kim et al.

(10) Patent No.: US 12,013,036 B2
(45) Date of Patent: Jun. 18, 2024

(54) COMPOSITE SEAL MATERIAL

(71) Applicant: Valqua, Ltd., Tokyo (JP)

(72) Inventors: Sangho Kim, Pyeongtaek-si (KR); Michi Kuroda, Tokyo (JP)

(73) Assignee: VALQUA, LTD., Tokyo (JP)

( * ) Notice: Subject to any disclaimer, the term of this patent is extended or adjusted under 35 U.S.C. 154(b) by 627 days.

(21) Appl. No.: 17/262,949

(22) PCT Filed: Jul. 25, 2019

(86) PCT No.: PCT/JP2019/029282
§ 371 (c)(1),
(2) Date: Jan. 25, 2021

(87) PCT Pub. No.: WO2020/026943
PCT Pub. Date: Feb. 6, 2020

(65) Prior Publication Data
US 2021/0310561 A1 Oct. 7, 2021

(30) Foreign Application Priority Data

Aug. 2, 2018 (JP) ................. 2018-145825

(51) Int. Cl.
| F16J 15/00 | (2006.01) |
| F16J 15/02 | (2006.01) |
| F16J 15/06 | (2006.01) |
| F16J 15/10 | (2006.01) |

(52) U.S. Cl.
CPC .......... *F16J 15/102* (2013.01); *F16J 15/025* (2013.01); *F16J 15/062* (2013.01); *F16J 15/104* (2013.01)

(58) Field of Classification Search
None
See application file for complete search history.

(56) References Cited

U.S. PATENT DOCUMENTS

| 7,866,669 B2 | 1/2011 | Kobayashi et al. |
| 9,447,881 B2 | 9/2016 | Tsuji |
| 2008/0018058 A1 | 1/2008 | Kobayashi et al. |
| 2011/0018211 A1 | 1/2011 | Tsuji |

FOREIGN PATENT DOCUMENTS

| EP | 1640643 A1 | 3/2006 |
| JP | 2005164027 A | 6/2005 |
| JP | 2006090463 A | 4/2006 |

(Continued)

*Primary Examiner* — Alexander S Thomas
(74) *Attorney, Agent, or Firm* — The Webb Law Firm

(57) ABSTRACT

The present invention addresses a problem of providing a composite seal material that has performances, such as a vacuum sealing performance, plasma resistance, and corrosive gas resistance, in combination, that does not require a strong pressing force during use, that does not have a possibility of generating particles, and that is capable of maintaining the vacuum sealing performance for a long period of time. Characteristics of a solution to the problem is a composite seal material having an annular shape and including a first member and a second member adjacent to each other on left and right. The first member includes a seal body portion, and a lip portion extending from the seal body portion upwardly in the thickness direction of the composite seal material. The lip portion of the first member extends in an inclined orientation outwardly on a side opposite to the second member adjacent thereto.

19 Claims, 11 Drawing Sheets

(56) References Cited

FOREIGN PATENT DOCUMENTS

| | | | |
|---|---|---|---|
| JP | 2006220229 | A | 8/2006 |
| JP | 5126995 | B2 | 1/2013 |
| JP | 2014214778 | A | 11/2014 |
| WO | 2009038022 | A1 | 3/2009 |
| WO | 2009113417 | A1 | 9/2009 |

COMPOSITE SEAL MATERIAL

CROSS-REFERENCE TO RELATED APPLICATIONS

This application is the United States national phase of International Application No. PCT/JP2019/029282 filed Jul. 25, 2019, and claims priority to Japanese Patent Application No. 2018-145825 filed Aug. 2, 2018, the disclosures of which are hereby incorporated by reference in their entirety.

TECHNICAL FIELD

The present invention relates to a composite seal material to be used in a vacuum state and relates to, for example, a composite seal material to be used for a semiconductor manufacturing apparatus, such as a dry-etching apparatus and a plasma CVD apparatus.

BACKGROUND ART

Along with the development in the electronics industry, technology of manufacturing semiconductors that are to be materials of electronic components, such as an IC (integrated circuit) and a LSI (large-scale integrated circuit), has been remarkably advanced with an improvement in definition, a reduction in thickness, and the like as with those, in particular, in a personal computer and the like.

Therefore, requirements for members that are to be used for semiconductor manufacturing apparatuses have become strict, and seal materials to be used in, for example, semiconductor manufacturing apparatuses, such as a dry etching apparatus and a plasma CVD apparatus, are also no exception.

Meanwhile, a seal material to be used for a semiconductor manufacturing apparatus needs a vacuum sealing performance as a basic performance. Depending on the mounting place of the seal material, the seal material is required to have performances, such as plasma resistance and corrosive gas resistance, in combination.

Conventionally, as a seal material required to have the vacuum sealing performance, the plasma resistance, and, additionally, a corrosive gas resistance, a composite seal material 100 constituted, as illustrated in FIG. 10, by a first member 102 formed of fluororubber, and a second member 104 formed of a material harder than the first member 102 and constituted by a fluororesin having favorable plasma resistance and corrosive gas resistance has been used (for example, JPB 5126995).

When such a composite seal material 100 is mounted in a seal groove 154 provided in one member 152 of a semiconductor manufacturing apparatus 150, for example, the first member 102 is disposed on the side of one wall 156 of the seal groove 154 located on the side of atmosphere, and the second member 104 is disposed on the side of another wall 158 of the seal groove 154 located on a side exposed to an etching gas and plasma.

In this state, as illustrated in FIG. 11, the one member 152 and another member 160 are caused to approach each other to press the composite seal material 100 between the one member 152 and the other member 160, thereby ensuring a sealing state between the one member 152 and the other member 160 by the first member 102 and preventing the etching gas and the plasma by the second member 104 from entering the side of the first member 102 to avoid deterioration of the first member 102 and enable the sealing performance to be maintained for a long period of time.

SUMMARY OF INVENTION

Technical Problem

Since the sectional shape of such a conventional composite seal material 100 is a vertically symmetrical lump shape, a strong pressing force is required to seal a gap between the one member 152 and the other member 160, as illustrated in FIG. 11, by mounting the composite seal material 100 in the seal groove 154 of the one member 152 and causing the one member 152 and the other member 160 to approach each other.

In other words, although the composite seal material 100 is deformed when pressed between the one member 152 and the other member 160, the reaction force thereof when being compressed is strong because of the lump shape, and it is required to press the composite seal material 100 with a strong pressing force to obtain a sealing performance of the composite seal material 100.

Application of such a strong pressing force to the composite seal material 100 causes the second member 104 and the other wall 158 of the seal groove 154 to come into contact with each other, and, as a result of this being repeated, the second member 104 is abraded and has a possibility of generating particles.

Generation of particles affects the sealing performance and becomes a cause of a malfunction of the semiconductor manufacturing apparatus 150. Generation of particles is thus one of events to be desirably avoided, and a novel composite seal material has been desired in an actual situation.

The present invention has been made in consideration of such a situation, and an object of the present invention is to provide a composite seal material that has performances, such as a vacuum sealing performance, plasma resistance, and corrosive gas resistance, in combination, that does not require a strong pressing force during use, that does not have a possibility of generating particles, and that is capable of maintaining the vacuum sealing performance for a long period of time.

Solution to Problem

The present invention solves the above-described problems in the related art, and a composite seal material of the present invention is a composite seal material having an annular shape and including a first member and a second member that are adjacent to each other on left and right, in which the first member includes a seal body portion, and a lip portion extending from the seal body portion upwardly in a thickness direction of the composite seal material, and in which the lip portion of the first member extends in an inclined orientation outwardly on a side opposite to the second member adjacent thereto.

In the composite seal material of the present invention, the composite seal material is used to seal a gap between one member and another member, and, when the composite seal material is mounted in a seal groove provided in the one member, the first member is located on a side of one wall of the seal groove, and the second member is located on a side of another wall.

With the provision of such a lip portion, when a sealing performance is to be obtained by mounting the composite seal material in the seal groove and causing the one member and the other member to approach each other, the lip portion first abuts the other member and can ensure a sealed state, and it is thus possible to obtain the sealing performance with a weak pressing force.

Moreover, when the second member is to be caused to come into contact with the other wall of the seal groove, the second member is caused by only a weak force to come into contact with the other wall of the seal groove. Therefore, the composite seal material of the present invention has no possibility of generating particles and can maintain the vacuum sealing performance for a long period of time.

In the composite seal material of the present invention, an inclination angle of the lip portion is within a range of 30 to 60 degrees.

With such an inclination angle, when a sealing performance is to be obtained by mounting the composite seal material in the seal groove and causing the one member and the other member to approach each other, the lip portion reliably abuts the other member and is gradually tilted toward the seal body portion, and it is thus possible to reliably obtain the sealing performance with a weak pressing force.

In the composite seal material of the present invention, the seal body portion of the first member is provided with a bulge portion at a side portion on a side opposite to the second member adjacent thereto.

With thus provided bulge portion, when the shape of the seal groove is a dovetail groove or a single dovetail groove, it is possible to reliably prevent the composite seal material mounted in the seal groove from coming off from the seal groove.

In other words, the bulge portion is fitted into a gap between an inclined surface (the one wall) and the bottom wall of the seal groove, and the composite seal material can be prevented from coming off from the seal groove.

In the composite seal material of the present invention, a bottom of the seal body portion is constituted by a flat surface.

With such a flat surface, the composite seal material favorably sits with respect to the seal groove since the bottom wall of the seal groove and the bottom of the seal body portion come into surface contact with each other, and it is thus possible to reliably prevent the composite seal material from rotating in the seal groove.

In the composite seal material of the present invention, a bottom of the seal body portion is provided with a recess.

With the thus provided recess, when a sealing performance is to be obtained by mounting the composite seal material in the seal groove and causing the one member and the other member to approach each other, the composite seal material is pressed and deformed, and a portion of the composite seal material is inserted into the recess.

Therefore, in the state in which the recess is provided, the reaction force of the composite seal material is weakened, compared with a state in which the recess is not provided, and the sealing performance can be reliably obtained with a weak pressing force.

In the composite seal material of the present invention, the second member includes
a base portion, and
an extension piece extending from the base portion upwardly in the thickness direction of the composite seal material, and
the extension piece
extends in an inclined orientation toward the first member adjacent thereto.

With the thus configured second member, when a sealing performance is to be obtained by mounting the composite seal material in the seal groove and causing the one member and the other member to approach each other, the extension piece abuts the other member after the lip portion of the first member. The extension piece is, however, deformed with a weak pressing force because of the inclined orientation thereof, and the reaction force of the composite seal material can be weakened.

In addition, at this time, the extension piece abuts both the other wall of the seal groove and the other member, and thus, an etching gas and plasma can be reliably prevented by the extension piece from entering the side of the first member.

In the composite seal material of the present invention, an inclination angle of the extension piece is within a range of 50 to 80 degrees.

In particular, with such an inclination angle, when a sealing performance is to be obtained by mounting the composite seal material in the seal groove and causing the one member and the other member to approach each other, a range in which the other wall of the seal groove and the second member abut each other is widened, and the etching gas and the plasma can be reliably prevented by the extension piece from entering the side of the first member.

In the composite seal material of the present invention, a bottom of the base portion is constituted by a flat surface.

With the bottom of the base portion being such a flat surface, the composite seal material favorably sits with respect to the seal groove since the bottom and the bottom wall of the seal groove come into surface contact with each other, and it is thus possible to reliably prevent the composite seal material from rotating in the seal groove.

Further, since the range in which the bottom wall of the seal groove and the bottom of the base portion abut each other is wide, it is possible to reliably prevent the etching gas and the plasma from entering the side of the first member.

In the composite seal material of the present invention, the base portion is provided with
an engagement projection that is to be engaged with the first member.

With the thus provided engagement projection, the second member and the first member are reliably integrated with each other, and it is thus possible to reliably prevent that one of the first member and the second member comes off from the seal groove.

In addition, handling properties of the composite seal material is favorable since the first member and the second member are reliably integrated with each other.

In the composite seal material of the present invention, the first member is formed of an elastic member, and the second member is formed of a material harder than the first member.

With such a configuration, it is possible to ensure a sealing performance by the first member and prevent by the second member, for example, the etching gas and the plasma from entering the side of the first member. Therefore, the single composite seal material can have performances, such as a vacuum sealing performance, plasma resistance, and corrosive gas resistance, in combination.

In the composite seal material of the present invention, the first member and the second member are bonded to each other by an adhesive.

With the first member and the second member being thus bonded to each other, it is possible to reliably prevent that one of the members from coming off from the seal groove and from rotating.

In the composite seal material of the present invention, a maximum height of the composite seal material in the thickness direction of the composite seal material is within a range of 1.10 to 1.70 times with respect to a maximum depth of the seal groove.

With the maximum height within such a range, when a sealing performance is to be obtained by mounting the composite seal material in the seal groove and causing the one member and the other member to approach each other, the lip portion reliably abuts the other member and can ensure the sealing performance.

In the composite seal material of the present invention, a maximum width from an end of the first member to an end of the second member in a left-right direction of the composite seal material is within a range of 1.01 to 1.30 times with respect to a narrowest width of the composite seal material at an opening of the seal groove.

With the maximum width within such a range, when the seal groove is, in particular, a dovetail groove or a single dovetail groove, the composite seal material remains in the seal groove, and it is possible to reliably prevent the composite seal material from coming off from the seal groove.

In the composite seal material of the present invention,
the seal groove is
one of a dovetail groove, a single dovetail groove, and a rectangular groove.

With such a seal groove, the composite seal material of the present invention can be particularly suitably used.

In the composite seal material of the present invention, each of the one member and the other member is a semiconductor manufacturing apparatus.

In particular, semiconductor manufacturing apparatuses are required to have diverse characteristics including a feature of having performances, such as a vacuum sealing performance, plasma resistance, and corrosive gas resistance, in combination and a feature of not generating particles. The composite seal material of the present invention has these performances in combination and is even capable of reliably preventing generation of particles.

In the composite seal material of the present invention,
a different groove is further provided on an outer side of the seal groove provided in the one member, and a spacer member is disposed in the different groove.

With the spacer member that is thus further disposed, it is possible to reliably prevent the one member and the other member from directly coming into contact with each other. Therefore, it is possible to reliably prevent generation of metal particles by metal touch.

In the composite seal material of the present invention, when the spacer member is disposed in the different groove,
a projecting amount of the spacer member that projects from an opening of the different groove toward the other member is within a range of 0.30 to 1.00 mm.

With such a projecting amount, it is possible to prevent the one member and the other member from directly coming into contact with each other and possible to reliably maintain a sealing performance required for the composite seal material, for a long period of time.

Advantageous Effects of Invention

According to the composite seal material of the present invention, it is possible to provide a composite seal material that has performances, such as a vacuum sealing performance, plasma resistance, and corrosive gas resistance, in combination, that does not require a strong pressing force during use, that does not have a possibility of generating particles, and that can maintain the vacuum sealing performance for a long period of time.

DESCRIPTION OF EMBODIMENTS

Hereinafter, an embodiment of the present invention will be described in detail on the basis of the drawings.

Figure 1:
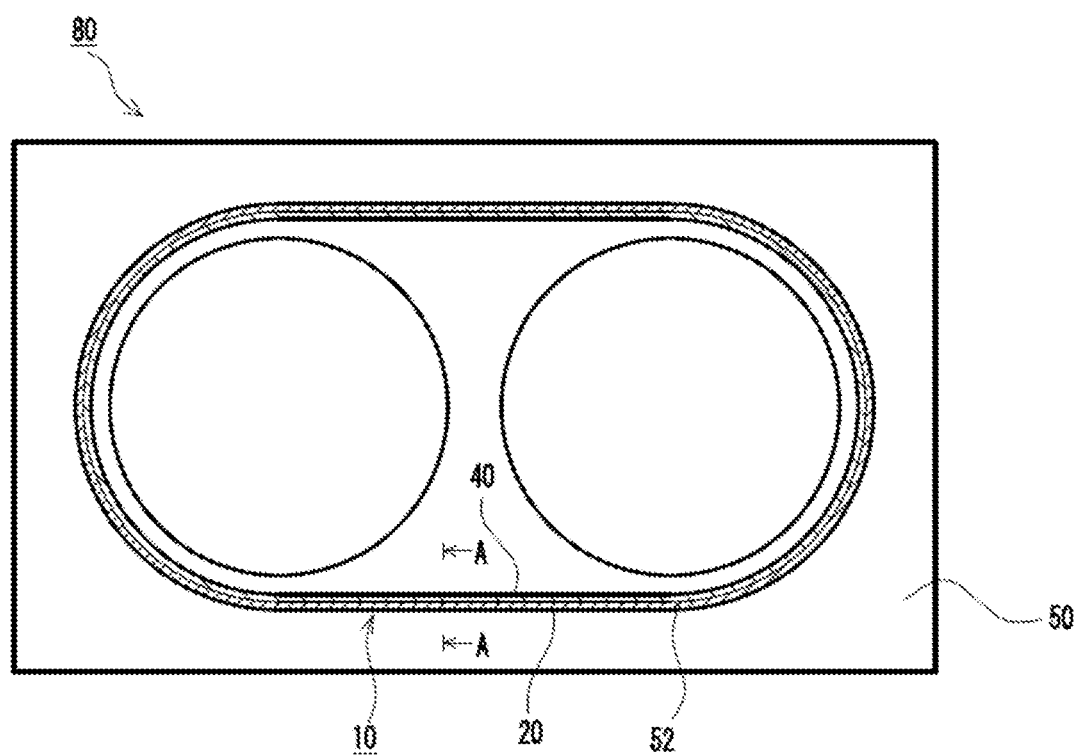
FIG. 1 is a schematic view of a semiconductor manufacturing apparatus in which a composite seal material of the present invention is mounted.
Figure 2:
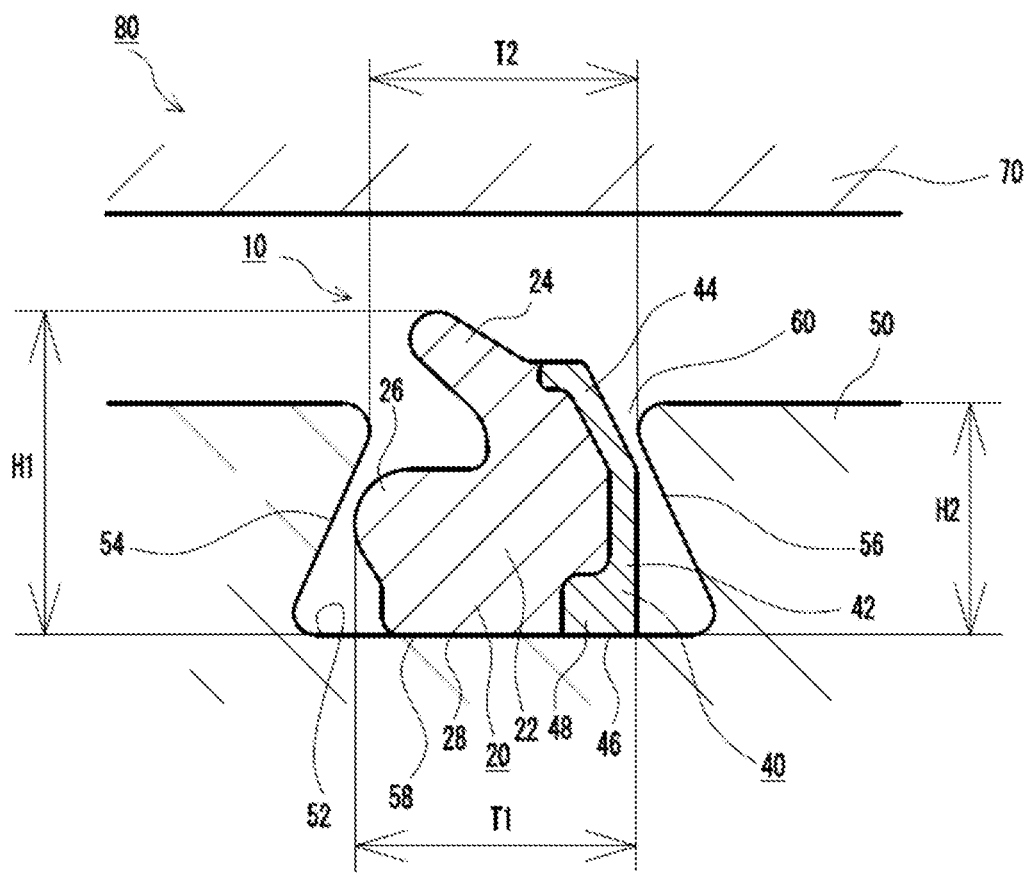
FIG. 2 is an enlarged sectional view of an A-A section of the semiconductor manufacturing apparatus illustrated in FIG. 1.

As illustrated in FIG. 1 and FIG. 2, a composite seal material 10 of the present invention is mounted in a seal groove 52 provided in one member 50 of a semiconductor manufacturing apparatus 80 and is used to seal a gap between the one member 50 and another member 70.

Figure 3:
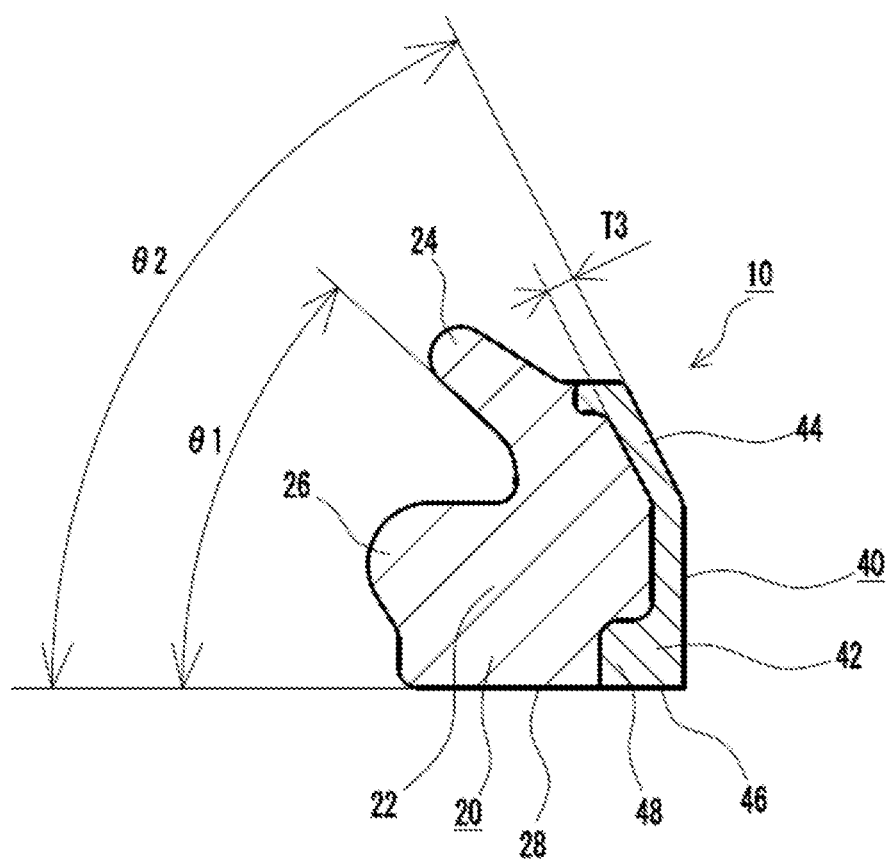
FIG. 3 is an enlarged sectional view of a main portion of the composite seal material of the present invention.

As a sectional shape, as illustrated in FIG. 2 and FIG. 3, in a state of being mounted in the seal groove 52 (a dovetail groove in the present embodiment), the composite seal material 10 includes a first member 20 located on the side (the side of atmosphere in the present embodiment) of one wall 54 of the seal groove 52, and a second member 40 located on the side (on the side of severe environment, such as a corrosive gas, plasma, and the like, in the present embodiment) of another wall 56 of the seal groove 52, the first member 20 and the second member 40 being coupled to each other and constituting one composite seal material 10.

Such a first member 20 is formed of an elastic member, and, as the elastic member, for example, rubber can be presented. As the rubber, either of natural rubber and synthetic rubber may be employed, and, in particular, fluororubber is desirable.

As the fluororubber, binary vinylidene fluoride rubber, such as a vinylidene fluoride/hexafluoropropylene copolymer, a vinylidene fluoride/trifluorochloroethylene copolymer, and a vinylidene fluoride/pentafluoropropylene copolymer, ternary vinylidene fluoride rubber, such as a vinylidene fluoride/tetrafluoroethylene/hexafluoropropylene copolymer, a vinylidene fluoride/tetrafluoroethylene/perfluoroalkyl vinyl ether copolymer, and a vinylidene fluoride/tetrafluoroethylene/propylene copolymer, a tetrafluoroethylene/propylene copolymer, a tetrafluoroethylene/perfluoroalkyl vinyl ether copolymer, thermoplastic fluororubber, and the like can be presented.

The second member 40 includes a material harder than the first member 20 and is preferably constituted by, for example, a synthetic resin.

As the synthetic resin, one or more types of synthetic resins selected from a fluororesin, a polyimide resin, a polyamideimide resin, a polyetherimide resin, a polyphenylene sulfide resin, a polybenzimidazole resin, and a polyetherketone resin can be presented.

In particular, a fluororesin is preferable, and, as the fluororesin, a polytetrafluoroethylene (PTFE) resin, a tetrafluoroethylene-perfluoroalkyl vinyl ether copolymer (PFA) resin, a tetrafluoroethylene-hexafluoropropylene copolymer (FEP) resin, a tetrafluoroethylene-ethylene copolymer (ETFE) resin, a polyvinylidene fluorite (PVDF) resin, a polychlorotrifluoroethylene (PCTFE) resin, a chlorotrifluoroethylene-ethylene copolymer (ECTFE) resin, a polyvinyl fluoride (PVF) resin, and the like can be presented. Among these, the polytetrafluoroethylene (PTFE) resin is optimum in consideration of heat resistance, corrosive gas resistance, plasma resistance, and the like.

The first member 20 formed of such an elastic member includes a seal body portion 22 located on the side of a bottom wall 58 of the seal groove 52 provided in the one member 50, and a lip portion 24 extending from the seal body portion 22 toward an opening 60 of the seal groove 52.

Figure 4:
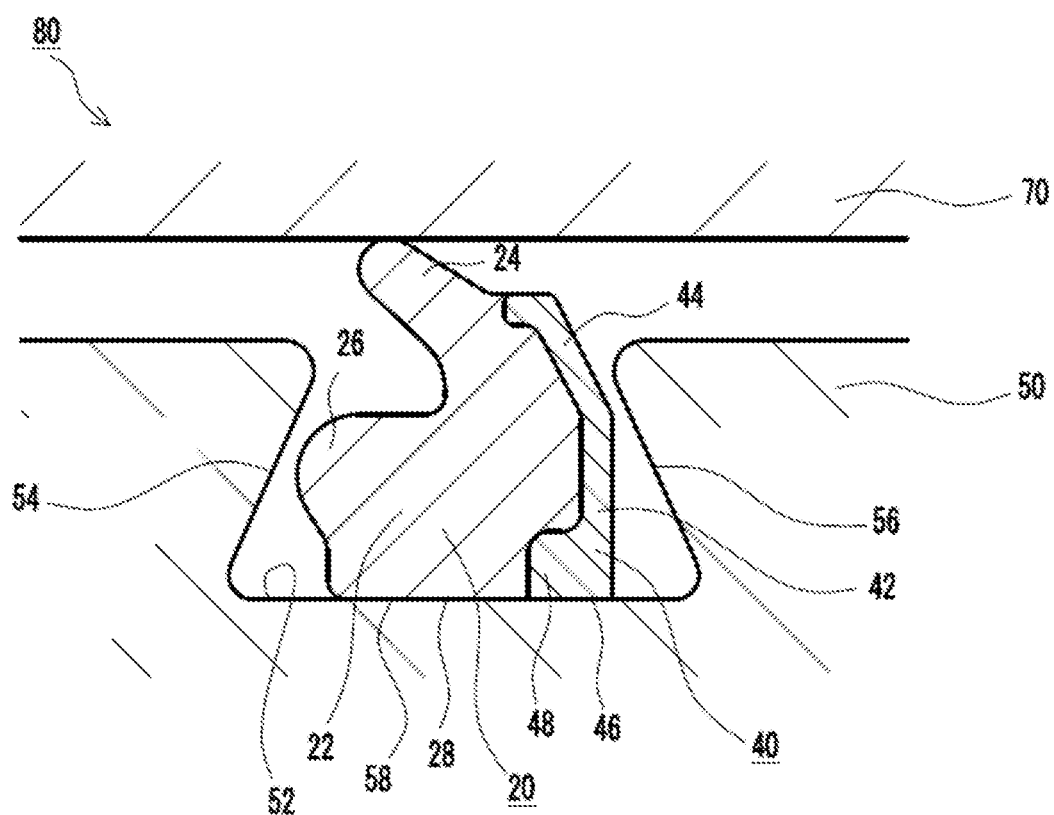
FIG. 4 is a sectional view of a state in which the composite seal material of the present invention is mounted in a seal groove and in which another member abuts a lip portion.

The lip portion 24 extends in an inclined orientation outwardly on a side opposite to the second member 40 adjacent thereto, and, as illustrated in FIG. 4, is a portion that first comes into contact with the other member 70 when the one member 50 and the other member 70 approach each other and is a portion to which a sealing performance is applied.

An inclination angle θ1 of the lip portion 24 is preferably within a range of 30 to 60 degrees, more preferably within a range of 35 to 50 degrees, and further preferably within a range of 40 to 45 degrees.

With such an inclination angle θ1, when a sealing performance is to be obtained by mounting the composite seal material 10 in the seal groove 52 and causing the one member 50 and the other member 70 to approach each other, the lip portion 24 reliably comes into contact with the other member 70 and is gradually tilted toward the seal body portion 22, and it is thus possible to reliably obtain the sealing performance with a weak pressing force.

The seal body portion 22 of the first member 20 is provided with a bulge portion 26 at a side portion thereof on a side opposite (the side of the one wall 54) to the adjacent second member 40.

The bulge portion 26 enables the composite seal material 10 mounted in the seal groove 52 to be reliably prevented from coming off from the seal groove 52.

In other words, the bulge portion 26 is fitted into a gap between the one wall 54 and the bottom wall 58 of the seal groove 52, and the composite seal material 10 can be reliably prevented from coming off from the seal groove 52.

A bottom 28 of the seal body portion 22 is constituted by a flat surface and thereby causes the bottom wall 58 of the seal groove 52 and the bottom 28 to surface contact with each other. Therefore, the composite seal material 10 favorably sits with respect to the seal groove 52, and it is possible to reliably prevent the composite seal material 10 from rotating in the seal groove 52.

When the first member 20 is mounted in the seal groove 52, the seal body portion 22 is located in the seal groove 52, and the most part of the lip portion 24 projects from the opening 60 of the seal groove 52 toward the other member 70.

The second member 40 adjacent to the first member 20 includes a base portion 42 located on the side of the bottom wall 58, and an extension piece 44 extending from the base portion 42 upwardly (toward the other member 70) in the thickness direction of the composite seal material 10.

When such a second member 40 is mounted in the seal groove 52, the base portion 42 is located in the seal groove 52, and the most part of the extension piece 44 projects from the opening 60 of the seal groove 52 toward the other member 70.

Figure 5:
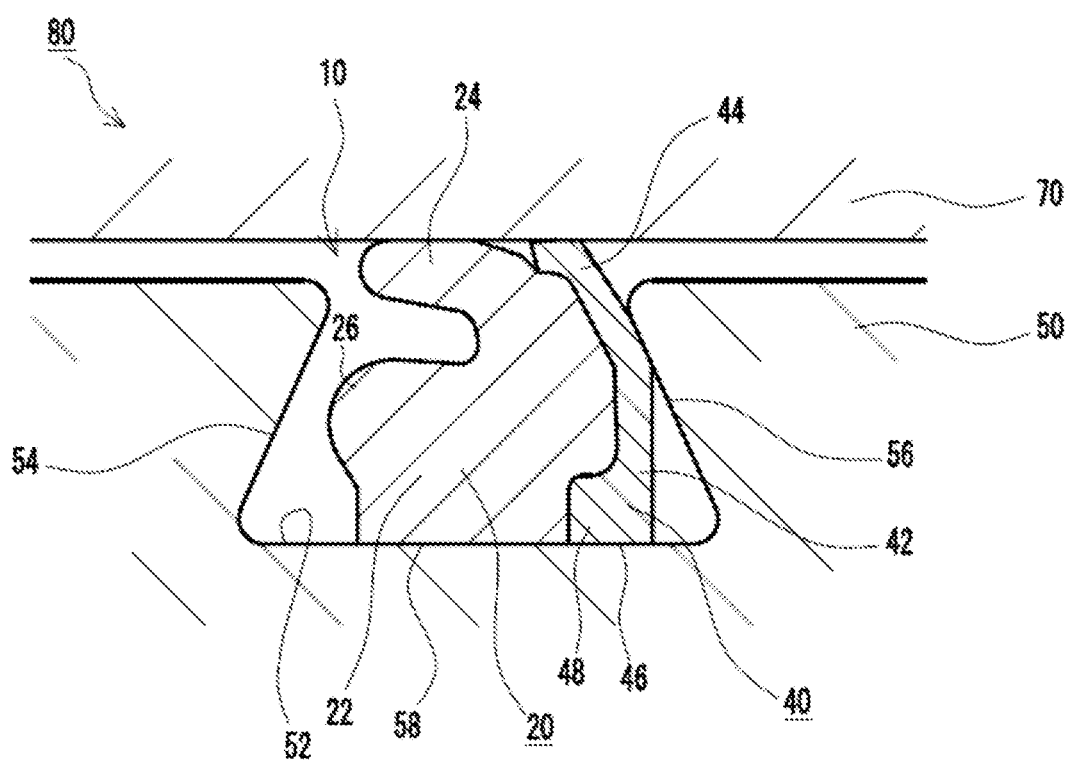
FIG. 5 is a sectional view of a state in which the composite seal material of the present invention is mounted in the seal groove and in which a sealing performance by the composite seal material is applied by causing one member and the other member to approach each other.

The extension piece 44 extends in an inclined orientation toward the adjacent first member 20, and consequently, when a sealing performance is to be obtained by mounting the composite seal material 10 in the seal groove 52 and causing the one member 50 and the other member 70 to approach each other, the extension piece 44 abuts the other member 70 after the lip portion 24 of the first member 20, as illustrated in FIG. 5. At this time, the extension piece 44 is in the inclined orientation, is thus deformed by a weak pressing force, and can weaken the reaction force of the composite seal material 10.

In addition, at this time, the extension piece 44 abuts both the other wall 56 of the seal groove 52 and the other member 70, and it is thus possible to reliably prevent the etching gas and the plasma from entering the side of the first member 20.

An inclination angle θ2 of the extension piece 44 is preferably within a range of 50 to 80 degrees, more preferably within a range of 55 to 75 degrees, and further preferably within a range of 60 to 70 degrees.

With such an inclination angle θ2, when a sealing performance is to be obtained by mounting the composite seal material 10 in the seal groove 52 and causing the one member 50 and the other member 70 to approach each other, a range in which the other wall 56 of the seal groove 52 and the second member 40 abut each other is widened, and it is possible to reliably prevent the etching gas and the plasma from entering the side of the first member 20.

A thickness T3 of the extension piece 44 is preferably within a range of 5 to 15%, more preferably within a range of 8 to 13%, and further preferably within a range of 10 to 12% with respect to a maximum width T1 from an end of the first member 20 to an end of the second member 40 in the left-right direction of the composite seal material 10.

With the thus set thickness T3 of the extension piece 44, the extension piece 44 is deformed by a weak pressing force and can weaken the reaction force of the composite seal material 10.

A bottom 46 of the base portion 42 is constituted by a flat surface and thereby causes the bottom 46 of the base portion 42 and the bottom wall 58 of the seal groove 52 to surface contact with each other. Therefore, the composite seal material 10 favorably sits with respect to the seal groove 52, and it is possible to reliably prevent the composite seal material 10 from rotating in the seal groove 52.

With the bottom 46 being a flat surface, a range in which the bottom wall 58 of the seal groove 52 and the bottom 46 of the base portion 42 abut each other is widened, and it is thus possible to reliably avoid the etching gas and the plasma from entering the side of the first member 20.

The base portion 42 is further provided with an engagement projection 48 that is to be engaged with the adjacent first member 20, and the second member 40 and the first member 20 are thereby to be reliably integrated with each other. Therefore, it is possible to reliably prevent that one of the first member 20 and the second member 40 comes off from the seal groove 52.

In addition, it is possible to improve handling properties of the composite seal material 10 since the first member 20 and the second member 40 are reliably integrated with each other.

To thus integrate the first member 20 and the second member 40 with each other with the engagement projection 48 interposed therebetween, it is favorable to additionally bond the first member 20 and the second member 40 to each other by an adhesive, preferably, by a heat-resistance adhesive.

When the composite seal material 10 of the present invention is mounted in the seal groove 52 such as that illustrated in FIG. 2, a maximum height H1 of the composite seal material 10 in the thickness direction is preferably within a range of 1.10 to 1.70 times, more preferably within a range of 1.20 to 1.60 times, and further preferably within a range of 1.35 to 1.40 times with respect to a maximum depth H2 of the seal groove 52.

With the maximum height H1 within such a range, when a sealing performance is to be obtained by mounting the composite seal material 10 in the seal groove 52 and causing the one member 50 and the other member 70 to approach each other, the lip portion 24 reliably abuts the other member 70 and can obtain the sealing performance.

The maximum width T1 from the end of the first member 20 to the end of the second member 40 in the left-right direction of the composite seal material 10 is preferably within a range of 1.01 to 1.30 times, more preferably within a range of 1.02 to 1.20 times, and further preferably within a range of 1.04 to 1.10 times with respect to a narrowest width T2 of the composite seal material 10 at the opening 60 of the seal groove 52.

With the maximum width T1 within such a range, when the seal groove 52 is, in particular, a dovetail groove or a single dovetail groove, the composite seal material 10 remains in the seal groove 52 and can be reliably prevented from coming off from the seal groove 52.

After the composite seal material 10 in which the first member 20 and the second member 40 are thus configured is disposed in the seal groove 52 as illustrated in FIG. 2, when the one member 50 and the other member 70 approach each other as illustrated in FIG. 4, the lip portion 24 first abuts the other member 70, and sealing of the gap between the one member 50 and the other member 70 is started.

Then, when the one member 50 and the other member 70 further approach each other, the lip portion 24 is tilted toward the seal body portion 22 as illustrated in FIG. 5, and the outer side of the lip portion 24 abuts the other member 70 in a large area.

Therefore, it is possible to reliably obtain a desired sealing performance while ensuring a sealing performance between the one member 50 and the other member 70 and without requiring a strong pressing force since the lip portion 24 is only tilted by the other member 70.

At this time, the extension piece 44 of the second member 40 also abuts the other member 70 and the other wall 56 of the seal groove 52 while being tilted toward the first member 20 by the other member 70, and it is thus possible to reliably avoid the etching gas and the plasma from entering the side of the first member 20.

Moreover, due to the thickness of the extension piece 44 being set as mentioned above, the extension piece 44 does not strongly slide even when abutting the other wall 56 of the seal groove 52 and has no possibility of generating particles.

Figure 6:
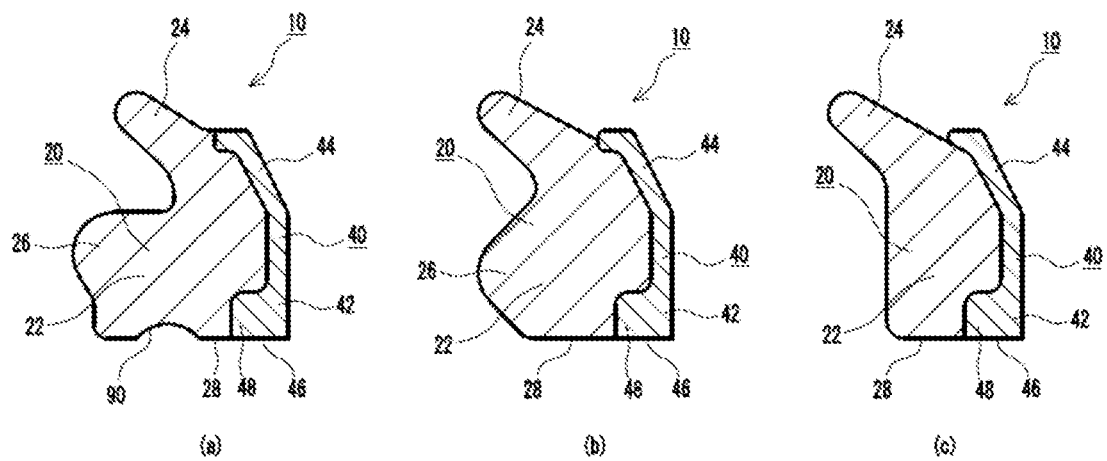
FIG. 6 is sectional views of other embodiments of the composite seal material of the present invention.

Regarding the composite seal material 10 of the present invention, a preferable embodiment has been described above; however, the composite seal material 10 of the present invention is not limited to the aforementioned embodiment and may be provided with, for example, as illustrated in FIG. 6(a), a recess 90 at the bottom 28 of the seal body portion 22 of the first member 20.

With the thus provided recess 90, when a sealing performance is to be obtained by mounting the composite seal material 10 in the seal groove 52 and causing the one member 50 and the other member 70 to approach each other, the composite seal material 10 is pressed, and a portion of the composite seal material 10 is inserted into the recess 90. Therefore, in the state in which the recess 90 is provided, the reaction force of the composite seal material 10 is weakened, compared with a state in which the recess 90 is not provided, and the sealing performance can be reliably obtained with a weak pressing force.

In addition, even an embodiment in which, as illustrated in FIG. 6(b), the shape of the bulge portion 26 of the first member 20 has a substantially triangular cross-section or in which, as illustrated in FIG. 6(c), the bulge portion 26 itself is not present may be employed depending on a situation.

Figure 7:
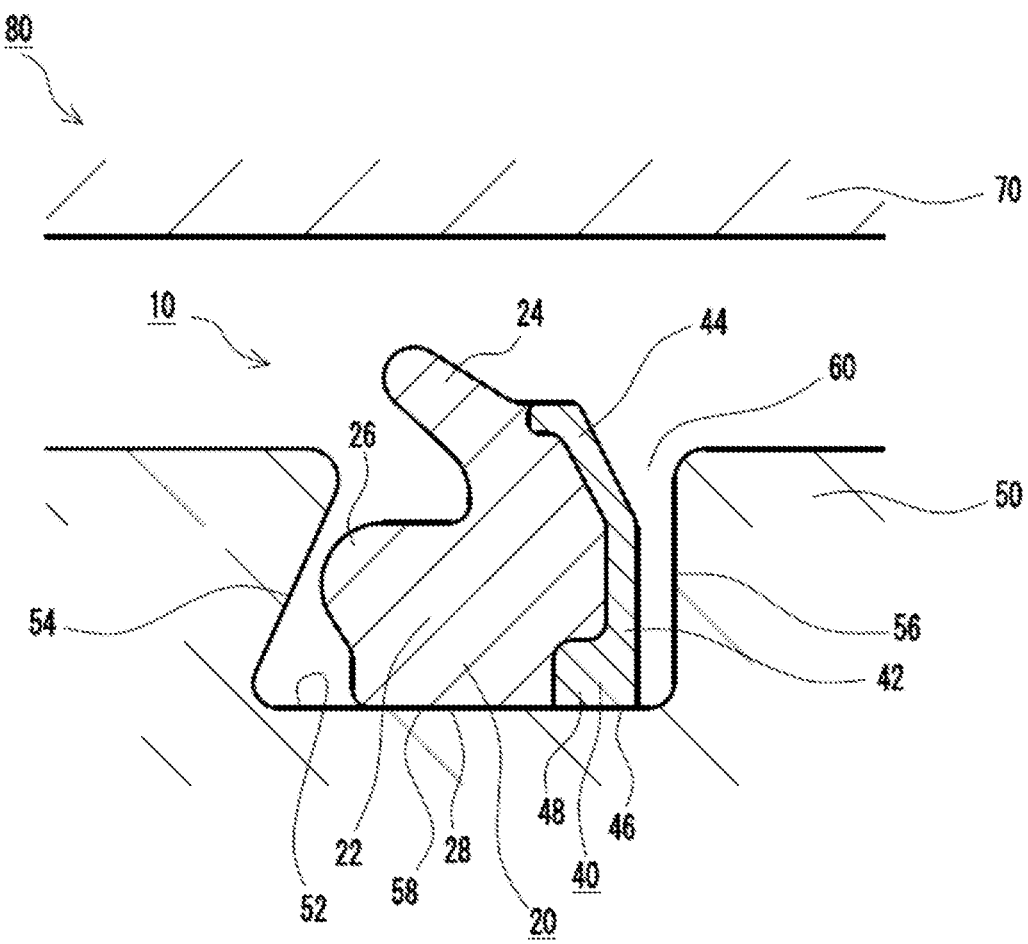
FIG. 7 is a sectional view of a state in which the composite seal material of the present invention is mounted in a single dovetail groove.
Figure 8:
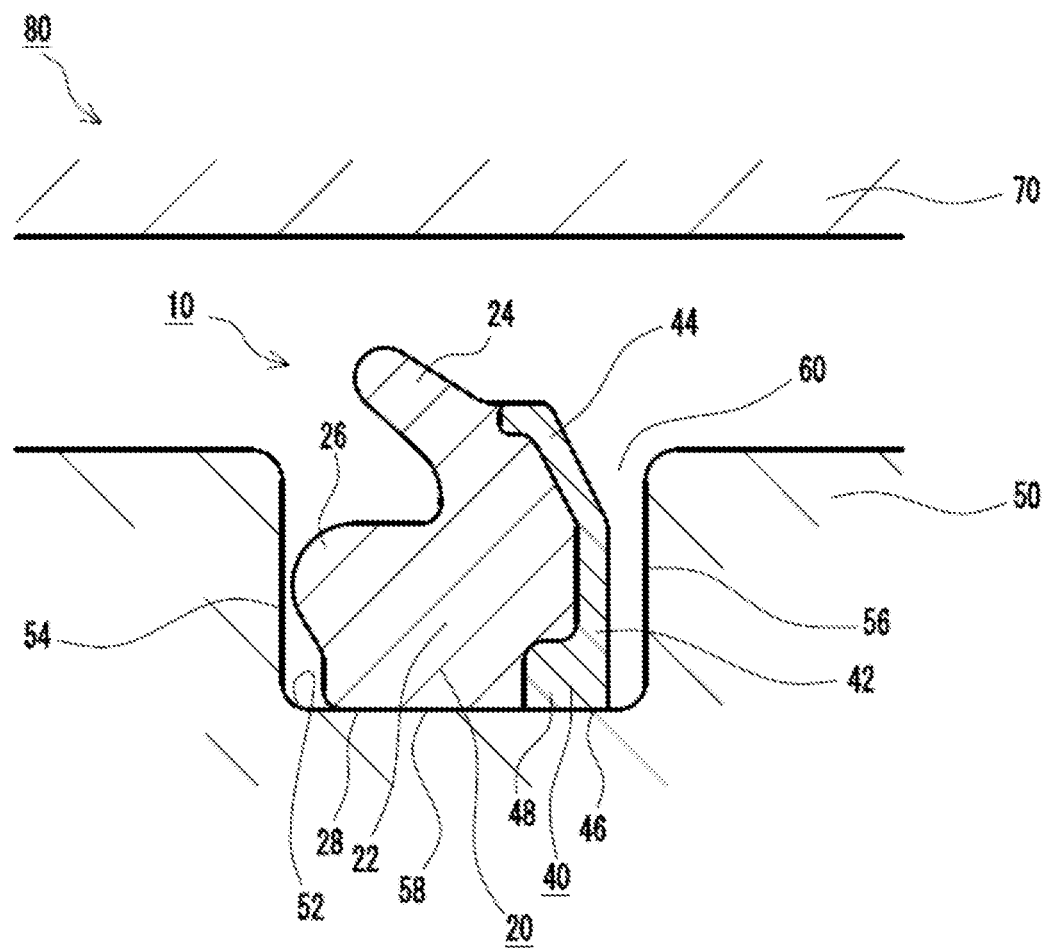
FIG. 8 is a sectional view of a state in which the composite seal material of the present invention is mounted in a rectangular groove.

Although the aforementioned embodiment has been described by presenting an example in which the seal groove 52 is a dovetail groove, the seal groove 52 may be, alternatively, a single dovetail groove as that illustrated in FIG. 7 or a rectangular groove such as that illustrated in FIG. 8.

Figure 9:
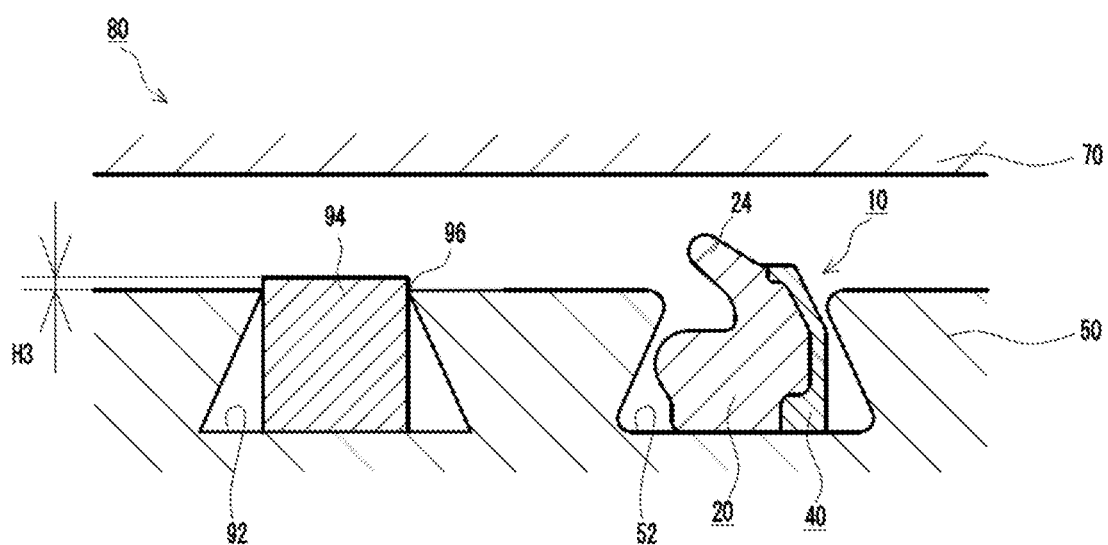
FIG. 9 is a sectional view of a state in which a different groove is provided on the outer side of a seal groove and in which a spacer member is disposed in the different groove.
Figure 10:
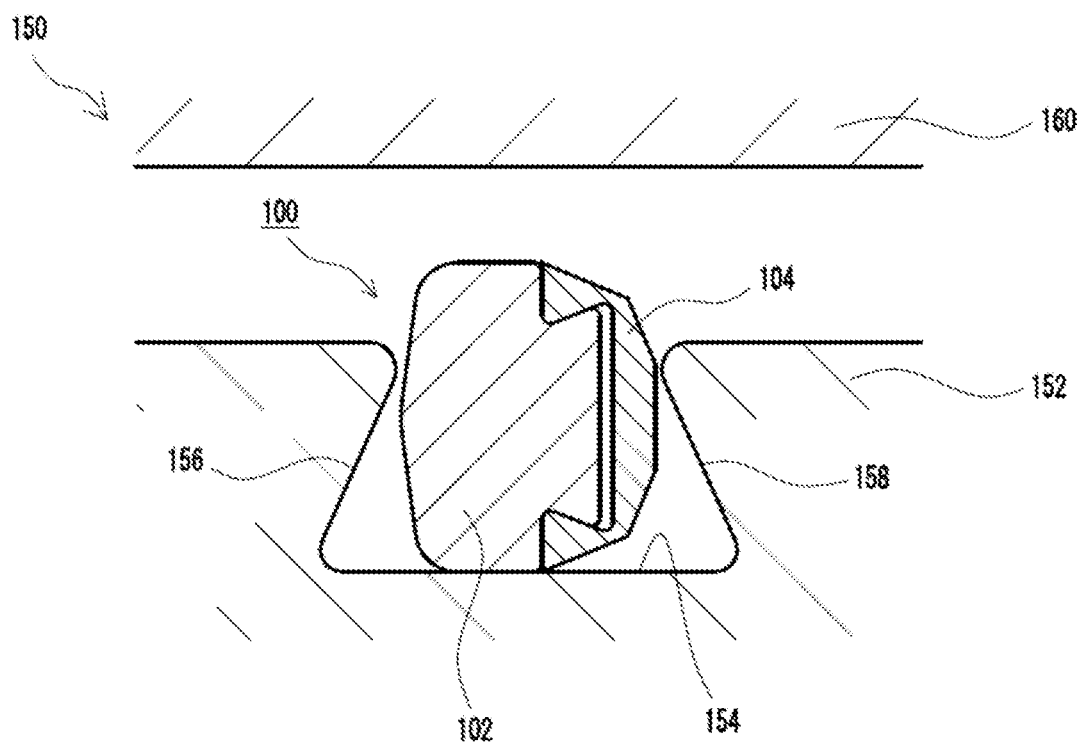
FIG. 10 is a sectional view of a state in which a conventional composite seal material is mounted in a seal groove.
Figure 11:
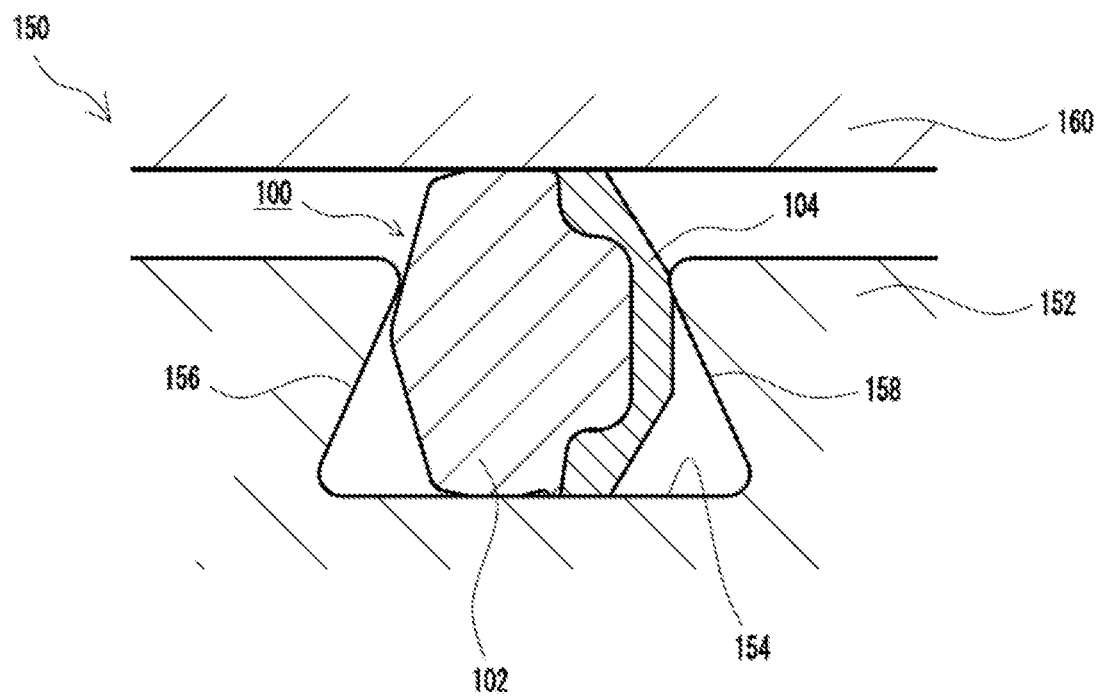
FIG. 11 is a sectional view of a state in which a conventional composite seal material is mounted in a seal groove and in which a sealing performance by the composite seal material is applied by causing one member and another member to approach each other.

Further, as illustrated in FIG. 9, a different groove 92 may be further provided on the outer side (the side of atmosphere) of the seal groove 52 provided in the one member 50, and a spacer member 94 may be disposed in the different groove 92. As a material of such a spacer member 94, PEEK (poly ether ether ketone) excellent in heat resistance, fatigue resistance, chemical resistance, hydrolysis resistance, and the like is suitable.

When the spacer member 94 is further disposed in the different groove 92, it is possible to reliably prevent the one member 50 and the other member 70 from directly coming into contact with each other.

In other words, when the one member 50 and the other member 70 are made of metal, metal touch can be prevented, and it is possible to reliably prevent generation of metal particles.

When the spacer member 94 is disposed in the different groove 92, a projecting amount H3 of the spacer member 94 projecting from an opening 96 of the different groove 92 toward the other member 70 is preferably within a range of 0.30 to 1.00 mm, more preferably within a range of 0.40 to 0.80 mm, and further preferably within a range of 0.45 to 0.55 mm.

With such a projecting amount H3, it is possible to reliably prevent the one member 50 and the other member 70 from directly coming into contact with each other and possible to reliably maintain the sealing performance required for the composite seal material 10 for a long period of time.

As described above, the composite seal material 10 of the present invention can be variously modified in a range not deviating from an object of the present invention.

REFERENCE SIGNS LIST 10 composite seal material
20 first member
22 seal body portion
24 lip portion
26 bulge portion
28 bottom
40 second member
42 base portion
44 extension piece
46 bottom
48 engagement projection
50 one member
52 seal groove
54 one wall
56 other wall
58 bottom wall
60 opening
70 other member
80 semiconductor manufacturing apparatus
90 recess
92 different groove
94 spacer member
96 opening
100 composite seal material
102 first member
104 second member
150 semiconductor manufacturing apparatus
152 one member
154 seal groove
156 one wall
158 other wall
160 other member
T1 maximum width of composite seal material
T2 narrowest width at opening of seal groove
θ1 inclination angle of lip portion
θ2 inclination angle of extension piece
H1 maximum height of composite seal material in thickness direction
H2 maximum depth of seal groove
H3 projecting amount of spacer member

The invention claimed is:

1. A composite seal material having an annular shape and comprising a first member and a second member that are adjacent to each other in a left-right direction,
wherein,
the first member includes:
a seal body portion; and
a lip portion extending from the seal body portion upwardly in a thickness direction of the composite seal material and having an inclination angle within a range of 30 to 60 degrees, and
the second member includes:
a base portion; and
an extension piece extending from the base portion upwardly in the thickness direction of the composite seal material and having an inclination angle within a range of 50 to 80 degrees, and wherein the lip portion of the first member extends in an inclined orientation outwardly on a side opposite to the second member adjacent thereto,
the extension piece extends in an inclined orientation toward the first member adjacent thereto and has an inclined outer surface on a side opposite the first member adjacent thereto, and
a bottom of the base portion is constituted by a flat surface.

2. The composite seal material according to claim 1, wherein the seal body portion of the first member is provided with a bulge portion at a side portion on a side opposite to the second member adjacent thereto.

3. The composite seal material according to claim 1, wherein a bottom of the seal body portion is constituted by a flat surface.

4. The composite seal material according to claim 1, wherein a bottom of the seal body portion is provided with a recess.

5. The composite seal material according to claim 1, wherein the base portion is provided with an engagement projection that engages the first member.

6. The composite seal material according to claim 1, wherein the first member is formed of an elastic member, and wherein the second member is formed of a material harder than the first member.

7. The composite seal material according to claim 1, wherein the first member and the second member are bonded to each other by an adhesive.

8. A seal comprising:
the composite seal material of claim 1;
and a dovetail groove provided in a first apparatus member,
wherein the composite seal material is used to seal a gap between the first apparatus member and a second apparatus member, and when the composite seal material is mounted in the dovetail groove, the first member is located on a side of one wall of the dovetail groove, and the second member is located on a side of the other wall of the dovetail groove.

9. The seal according to claim 8, wherein a maximum height of the composite seal material in the thickness direction is within a range of 1.10 to 1.70 times with respect to a maximum depth of the dovetail groove.

10. The seal according to claim 8, wherein a maximum width from an end of the first member to an end of the second member in a left-right direction of the composite seal material is within a range of 1.01 to 1.30 times with respect to a narrowest width of the composite seal material at an opening of the dovetail groove.

11. The seal according to claim 8, wherein each of the first apparatus member and the second apparatus member is a member of a semiconductor manufacturing apparatus.

12. The seal according to claim 8, wherein a different groove is further provided on an outer side of the dovetail groove provided in the first apparatus member, and a spacer member having a substantially quadrangular cross-section is disposed in the different groove.

13. The seal according to claim 12, wherein, when the spacer member is disposed in the different groove, a projecting amount of the spacer member that projects from an opening of the different groove toward the other member is within a range of 0.30 to 1.00 mm.

14. The seal according to claim 8, wherein the seal body portion of the first member is provided with a bulge portion at a side portion on a side opposite to the second member adjacent thereto.

15. The seal according to claim 8, wherein a bottom of the seal body portion is constituted by a flat surface.

16. The seal according to claim 8, wherein a bottom of the seal body portion is provided with a recess.

17. The seal according to claim 8, wherein the base portion is provided with an engagement projection that engages the first member.

18. The seal according to claim 8, wherein the first member is formed of an elastic member, and wherein the second member is formed of a material harder than the first member.

19. The seal according to claim 8, wherein the first member and the second member are bonded to each other by an adhesive.

* * * * *